United States Patent [19]

Sugarman et al.

[11] Patent Number: 5,567,909

[45] Date of Patent: Oct. 22, 1996

[54] METHOD FOR SUPPORTING A WAFER IN A COMBINED WAFER SUPPORT AND TEMPERATURE MONITORING DEVICE

[75] Inventors: Michael N. Sugarman, San Francisco; Michael Beesely, Sunnyvale; Shannon J. Kelsey, Los Gatos; Robert J. Steger, Cupertino, all of Calif.

[73] Assignee: Applied Materials Inc., Santa Clara, Calif.

[21] Appl. No.: 309,305

[22] Filed: Sep. 20, 1994

Related U.S. Application Data

[62] Division of Ser. No. 664,578, Mar. 4, 1991, Pat. No. 5,356,486.

[51] Int. Cl.$^6$ ................................................ H01L 35/34
[52] U.S. Cl. .................. 136/201; 136/221; 136/230; 136/231; 374/179; 374/208
[58] Field of Search ..................... 136/201, 221, 136/200, 231, 232, 233; 374/179, 208

[56] References Cited

U.S. PATENT DOCUMENTS

| | | | |
|---|---|---|---|
| 4,091,673 | 5/1978 | Tamura et al. | 73/351 |
| 4,527,005 | 7/1985 | McKelvey et al. | 136/221 |
| 4,951,601 | 8/1990 | Maydan et al. | 118/719 |
| 5,098,198 | 3/1992 | Nulman et al. | 374/121 |
| 5,106,200 | 4/1992 | Hosokawa | 374/121 |
| 5,356,486 | 10/1994 | Sugarman et al. | 136/230 |

OTHER PUBLICATIONS

Omego Technologies Company, *The Temperature Handbook*, 1989, pp. A–31, A–42, Z–33 and Z–45.

*Primary Examiner*—Charles T. Jordan
*Assistant Examiner*—Chrisman D. Carroll
*Attorney, Agent, or Firm*—Peter J. Sgarbossa; Noel F. Heal

[57] ABSTRACT

A combined wafer support and thermocouple assembly comprising a wafer support basket having a plurality of wafer support fingers, one of which includes a low mass, low heat constant support for supporting a thermocouple against the backside of a wafer positioned on the basket.

4 Claims, 6 Drawing Sheets

METHOD FOR SUPPORTING A WAFER IN A COMBINED WAFER SUPPORT AND TEMPERATURE MONITORING DEVICE

This is a divisional application of Ser. No. 07/664,578, filed Mar. 4, 1991, now U.S. Pat. No. 5,356,486.

BACKGROUND OF THE INVENTION

1. Field of the Invention

The present invention relates to measurement of temperatures inside a vacuum chamber and, more particularly, to apparatus and methods for accurate, real time measurement and control of semiconductor wafer temperatures during processing in a vacuum processing chamber.

2. Prior Art Technology and Problems

At least several factors require fast, accurate, real time measurement of semiconductor wafer temperatures during plasma processing such as the etching or stripping of photoresist from semiconductor wafers. First, such processes are strongly temperature dependent. In fact, such processes may be an exponential or near-exponential function of temperature. Second, to achieve process control, frequently it is necessary to quickly ramp up the wafer temperature from ambient or near-ambient to the elevated processing temperature, and/or, after processing, quickly ramp down the temperature. Third, PID (proportional, integral, differential) and other automated temperature monitoring techniques are, or are fast becoming, the industry choice for precise temperature control during semiconductor wafer processing. Individually and collectively, these and other factors require fast, accurate, real time monitoring and/or control of semiconductor wafer temperatures during in vacuo processing (etching and deposition). Unfortunately, fast accurate temperature monitoring under vacuum processing conditions is inherently difficult and may be made more difficult by process conditions such as very low processing pressures (high vacuum) and low temperatures.

Indirect wafer temperature monitoring techniques, such as infrared and pyrometer techniques are available to the semiconductor processing industry. Typically, however, such techniques are insufficiently precise at lower temperatures. For example, accurate low temperature monitoring using infrared techniques is hampered by the relatively low intensity of radiation emanating from silicon semiconductor wafers below about 300° C. Furthermore, the variation in emissivity from wafer to wafer makes radiation-based techniques unreliable for use in a process chamber which sees a wide variety of wafer types (for example, different dopant levels). Also, the presence of heating lamps may present a difficulty with respect to noise.

Direct temperature measurement, that is, monitoring the wafer temperature at the wafer using thermocouples or other temperature sensors, also has been used. However, factors such as the degradation of the sensor by corrosive processing environments, interaction between the sensor and the heating medium, and the difficulty in maintaining a stable thermal connection between the sensor and the wafer typically preclude achieving the requisite monitoring accuracy and sensor longevity.

SUMMARY OF THE INVENTION

In one aspect our present invention, which has the objective of improving upon prior temperature monitoring techniques and the above-discussed limitations of such techniques, is embodied in a combined wafer support and thermocouple assembly, which includes a wafer support basket that comprises a plurality of wafer support fingers for collectively supporting a wafer thereon. One of the fingers comprises a base and a support member of low mass and low heat constant which is mounted on the base and has an elevated section for supporting a wafer. The thermocouple is supported on the elevated section of the support member so that positioning a wafer on the wafer support basket presses the thermocouple junction against the support member, providing thermal connection between the thermocouple junction and the wafer and shielding the junction from any radiation emanating from beneath the wafer. Embodiments of the support member include ceramic felt, a quartz bracket, and shaped wire.

In another aspect, our invention is embodied in a combined support and thermocouple assembly, comprising: a wafer support basket, including a generally semi-circular ring having a plurality of wafer support fingers for collectively supporting a wafer thereon; temperature sensing means comprising a thermocouple having a thermocouple junction, and electrical wiring including a first section for connecting to an electrical monitoring circuit outside the chamber and a second section connected to the thermocouple; connector means comprising a first connector adapted for detachable mounting to the wafer support basket and for capturing the first wiring section, and a second connector adapted for detachable mounting to the wafer support basket and for capturing the second wiring section, the two connectors being adapted for maintaining contact between the two wiring sections; one of the fingers comprising a base and a support member of low mass and low heat constant mounted on said base, the support member having an elevated section for supporting the wafer; and wherein the thermocouple junction is supported on the elevated section of the support member so that positioning a wafer on the wafer support basket presses the thermocouple junction against the support member, providing thermal connection between the thermocouple junction and the wafer and shielding the junction from any radiation emanating from beneath the wafer.

DETAILED DESCRIPTION OF THE PREFERRED EMBODIMENT(S)

1. Overview of Combination Wafer Support/Temperature Monitoring Device

Our present invention is embodied in a thermocouple device which provides direct, accurate wafer temperature measurement during rapid thermal processing of a workpiece such as a semiconductor wafer. The device is adapted to operate in caustic process chemistries which include gases such as $CF_4$, $O_2$, $N_2$, $NH_3$, $N_2$, $H_2$; to wafer backside heating using thermal radiation; to low process pressures such as 1–2 torr; and to low process temperatures such as 100° C. to 450° C. Our thermocouple device is built into and is an integral part of one of the support fingers of a basket-type wafer support assembly. The resulting combined thermocouple-and-wafer support finger assembly is attached to the wafer support basket using a connector that provides both electrical and mechanical connection. The associated output signal lines pass through a vacuum-to-atmosphere hermetic feed-through. In one working embodiment, the thermocouple device comprises a bare junction of type K thermocouple material ("Alumel"-"Chromel") with the signal lead wires running through a standard metal sheath. "Alumel" is an alloy of 95% nickel, 2% manganese and 2% aluminum, and "Chromel" is an alloy of 90% nickel and 10% chromium. The end of the sheath at the thermocouple end is sealed with a glass adhesive and the entire component is coated with a ceramic protective coating such as magnesium fluoride. The basket may be aluminum.

The design and material used in the combined thermocouple-wafer finger support assembly and, in particular, in the support itself, are critical to the performance of the thermocouple, in part because the support must provide stable wafer-to-thermocouple contact and must shield and insulate the thermocouple junction from any radiation emanating from beneath the wafer. The material and the design of the support directly affects the speed of response of the thermocouple assembly, which is critical to providing the accurate and responsive monitoring of wafer temperature which is necessary to eliminate overshoot of the desired wafer temperature set point. Thus, typically the design and material must ensure that the backside wafer-thermocouple support (1) shields and insulates the thermocouple junction from radiation; (2) reliably supports the thermocouple junction in contact with the wafer; (3) contributes negligible or minimal heat loss from the thermocouple, which typically requires low mass, a low value of specific heat constant and a low value of thermal conductivity constant; (4) contributes negligible particle contamination; and (5) can withstand (i.e., is not rapidly consumed by) caustic process chemistry. As will be appreciated, several of these criteria are conflicting. For example, it is desirable that the finger assembly shield and insulate the thermocouple junction from the radiation lamps (criterion (1)), yet it is also desirable that the finger assembly have substantially the thermal characteristics of air (criterion (3)).

2. Construction of Combination Wafer Support/Temperature Monitoring Device

Figure 1:
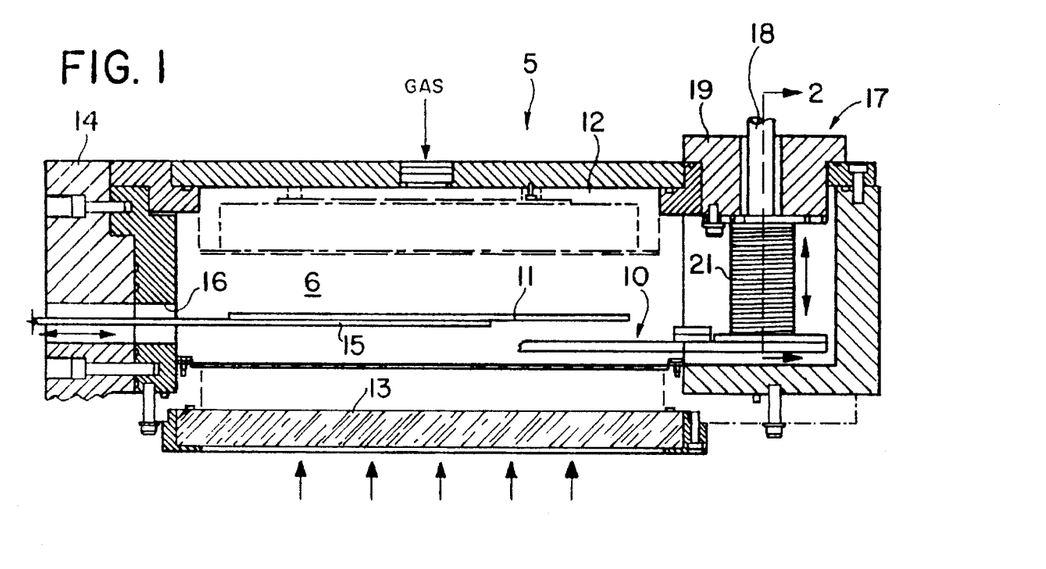
FIG. 1 is a simplified cross-section of an exemplary rapid thermal processing reactor system which utilizes our combined wafer support and temperature monitoring device.

FIG. 1 is a simplified cross-sectional view of a vacuum-processing reactor 5 which incorporates our invention. The reactor system includes a housing which defines a processing chamber 6 containing a combined basket/thermocouple assembly 10. This assembly supports and monitors the temperature of a semiconductor wafer 11 during high vacuum, low temperature processing using gases supplied via gas inlet manifold 12 and radiant energy supplied by an array of lamps (not shown) through quartz window 13 in the bottom of the processing chamber. The exemplary reactor 5 is mounted to the wall 14 of a robot chamber such as that described in commonly assigned U.S. Pat. No. 4,951,601, entitled "Multi-Chamber Integrated Process System", issued Aug. 26, 1990, in the name of inventors Maydan et al, which patent is incorporated by reference.

Wafers 11 are supplied to the basket 10 for processing, and are retrieved from the basket, by a robot transfer blade 15 which is mounted in the associated robot chamber described in the incorporated patent. Blade 15 accesses chamber 6 via a slit 16, access to which is controlled by a slit valve (not shown) located on the robot chamber side of the slit.

Figure 3:
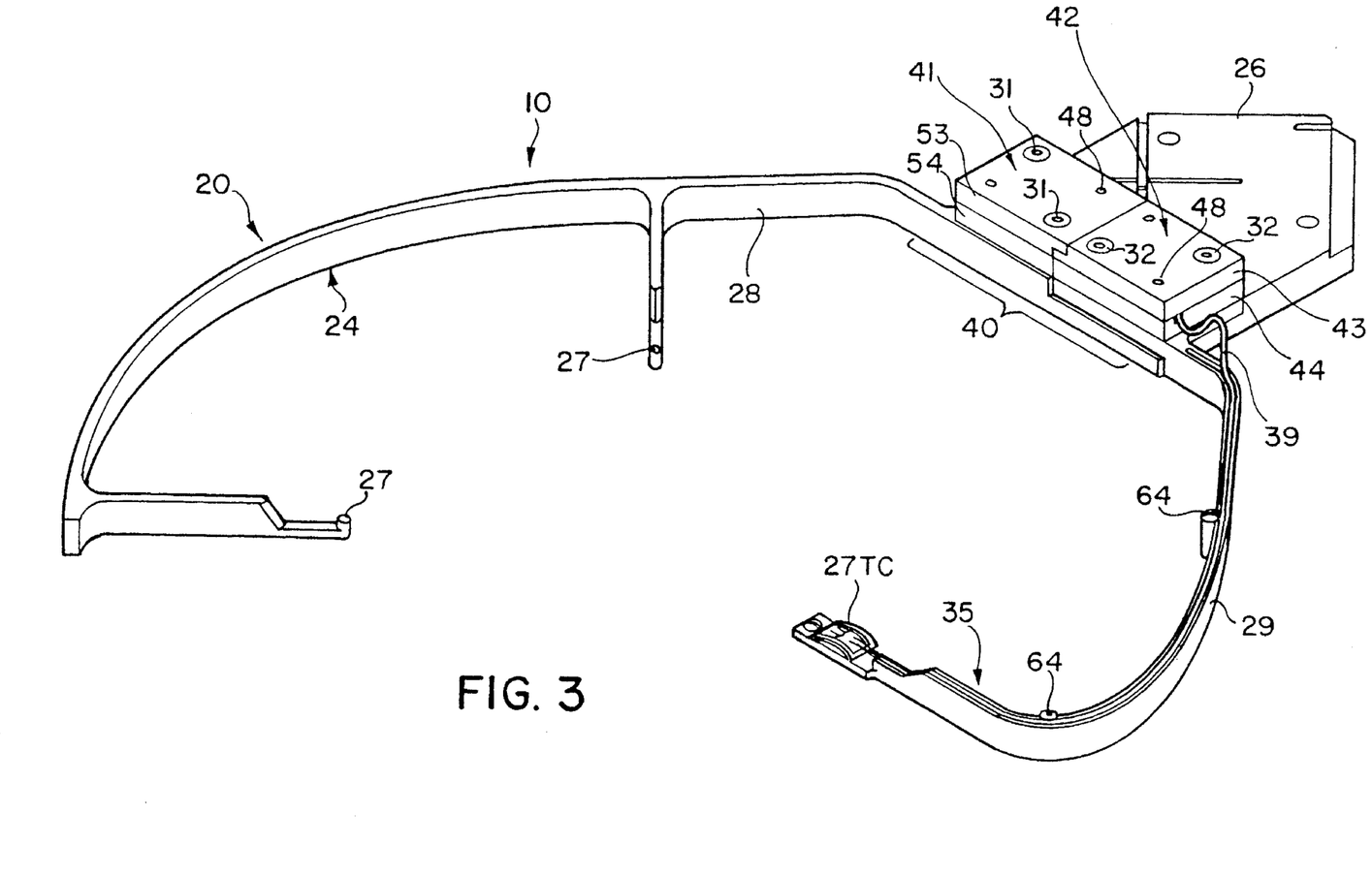
FIG. 3 is a perspective view of the wafer support basket assembly according to our present invention.

The combined basket and thermocouple assembly 10 is moved vertically to selected positions (for receiving wafers from the blade, returning wafers to the blade and for processing) by a transfer lift mechanism 17 comprising a shaft 18 which is rigidly mounted to the basket base 26, FIG. 3. Typically the shaft is moved vertically upward and downward by a stepper motor-driven screw drive mechanism (not shown). A bellows 21 mounted between the base 26 and feed-through block 19 isolates the vacuum chamber 6 from the lift mechanism.

Figure 4:
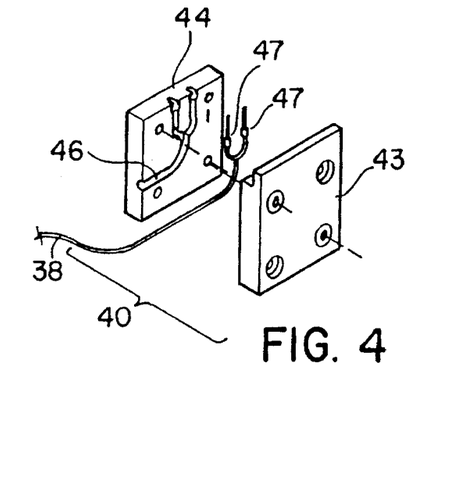
FIG. 4 is an exploded view of one of the thermocouple-to-basket connector assemblies.
Figure 5:
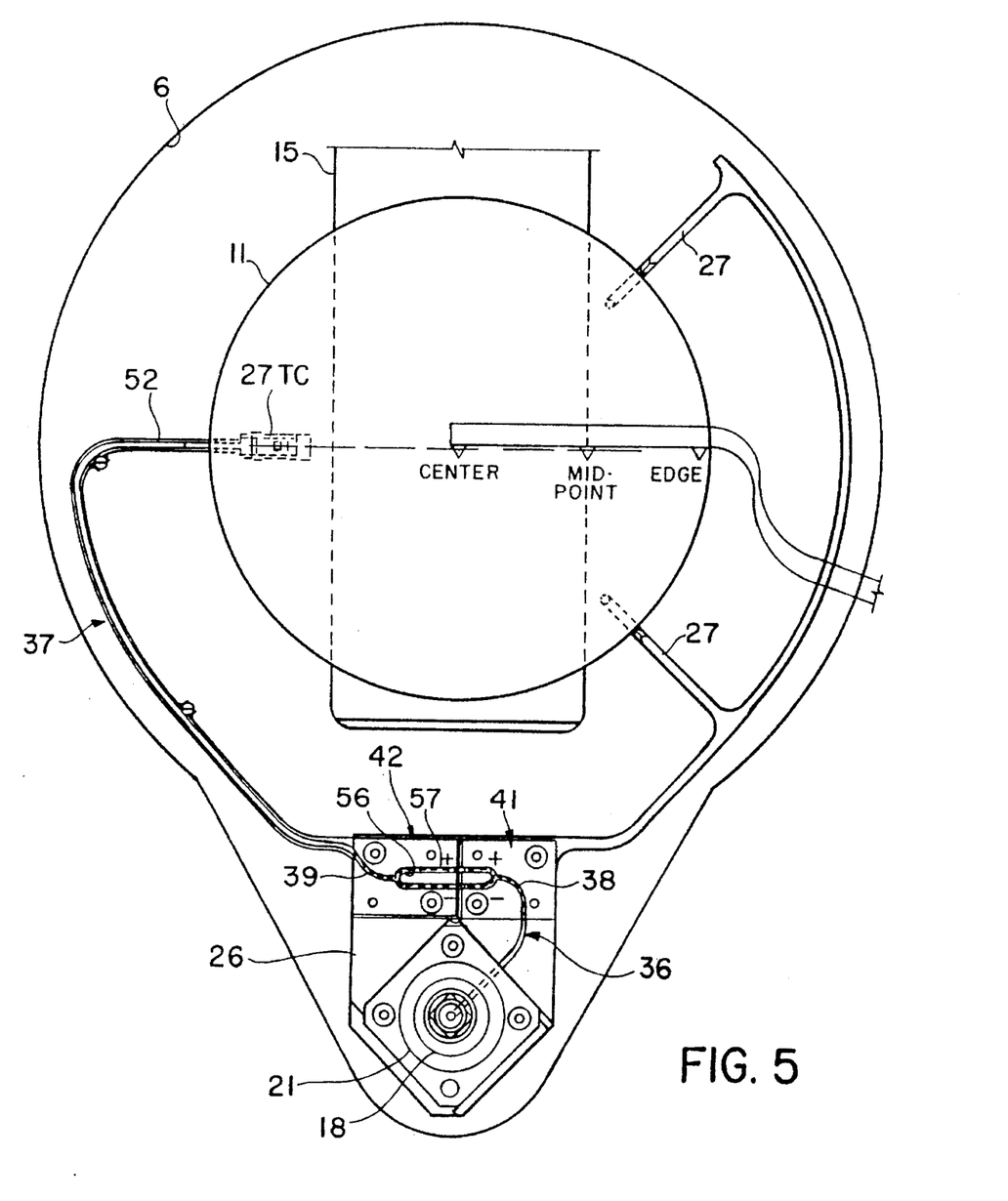
FIG. 5 is a top plan view, partly in section, showing the wafer support basket assembly of FIG. 3 and its relationship to the processing chamber, a semiconductor wafer, and the robot transfer blade which is used to insert wafers into and remove wafers from the chamber.

Referring in particular to FIGS. 3–5, the combined basket and thermocouple assembly 10 comprises a basket 20 and a thermocouple assembly 35, which itself comprises a feed-through section 36 and a thermocouple section 37. The basket is a two-piece semicircular ring 24. One section 28 of the ring includes two wafer support fingers 27—27 and is formed integrally with the base 26. The second basket section 29 is mounted to the base 26 by screws 32. The second basket section 29 includes a third wafer support finger 27TV which is a combination wafer support, thermocouple support, and thermocouple-to-wafer contact finger. This second section and the thermocouple may be conveniently detached from the basket and base for servicing or maintenance.

Figure 2:
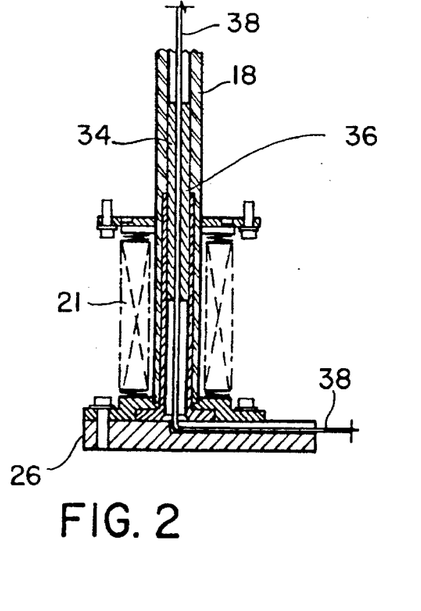
FIG. 2 is a cross-section view taken along lines 2—2 in FIG. 1.

Referring also to FIG. 2, the thermocouple feed-through section 36 comprises wires 38 which connect to conventional monitoring and control apparatus outside the chamber 6, for controlling process parameters including gas flow and pressure in response to the wafer temperature information contained in the electrical signals supplied by the thermocouple. Wires 38 are routed through a bore in the lift mechanism shaft 18 which is filled with epoxy 34 to provide a vacuum seal. From the shaft, the wires 38 are routed to an in-line mechanical and electrical thermocouple connector assembly 40 comprising plug 41 and receptacle 42. Referring to FIG. 4, plug 41 comprises upper and lower ceramic plates 43 and 44 having mating surface grooves 46—46 therein for capturing the wires 38 and two male connectors 47—47. The plates 43, 44 are assembled using screws 48. The assembled connector is mounted to the basket 24/base 26 by screws 31.

As shown in FIGS. 3 and 5, the receptacle 42 mounts the monitoring thermocouple section 37 to the base 26 and connects section 37 to the feed-through section 36. Receptacle 42 comprises mating upper and lower ceramic plates 53 and 54 having internal surface grooves 56 for capturing two female connectors 57—57 which are connected to the thermocouple wires 39 and mate with the connectors 47—47 of the feed-through wires. The receptacle plates are assembled using screws 48 and the assembled receptacle is mounted to the basket base 26 by screws 32. Please note, the connector 40 is readily disassembled, to permit thermocouple maintenance or replacement, by detaching the receptacle 42 and/or plug 41 from the base and then re-attaching the receptacle and/or plug.

Referring now primarily to FIGS. 3 and 5–7, the in-chamber monitoring thermocouple section 37 comprises the above-mentioned electrical wires 39 which are encased in a sheath 52. Preferably, the sheath is magnesium fluoride-coated nickel. Basket section 29 has a thermocouple-receiving groove 63 defined in the upper surface thereof between spaced ribs 62—62. Screws 64, FIG. 3, may be used to secure the thermocouple leads within the groove.

Figure 6:
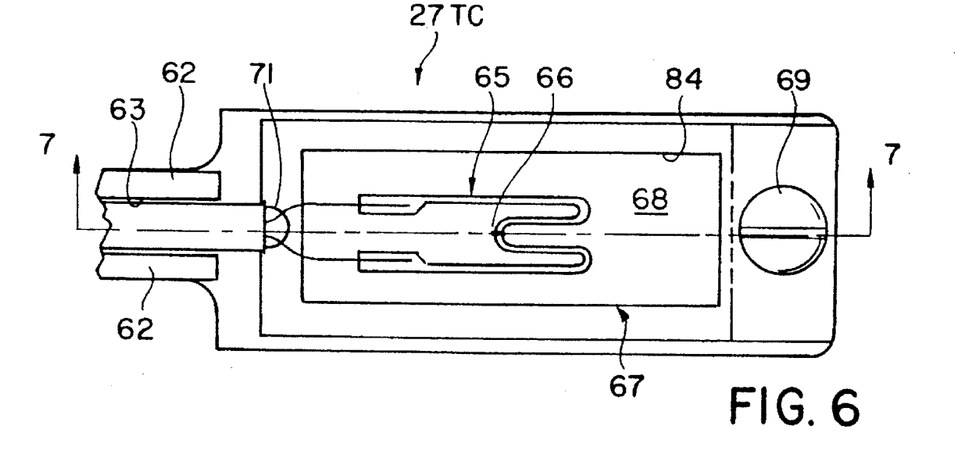
FIGS. 6 and 7 are a top plan view and a side elevation view, respectively, of one presently preferred embodiment of a combined wafer support and thermocouple support finger which may be used in the wafer support basket assembly.
Figure 7:
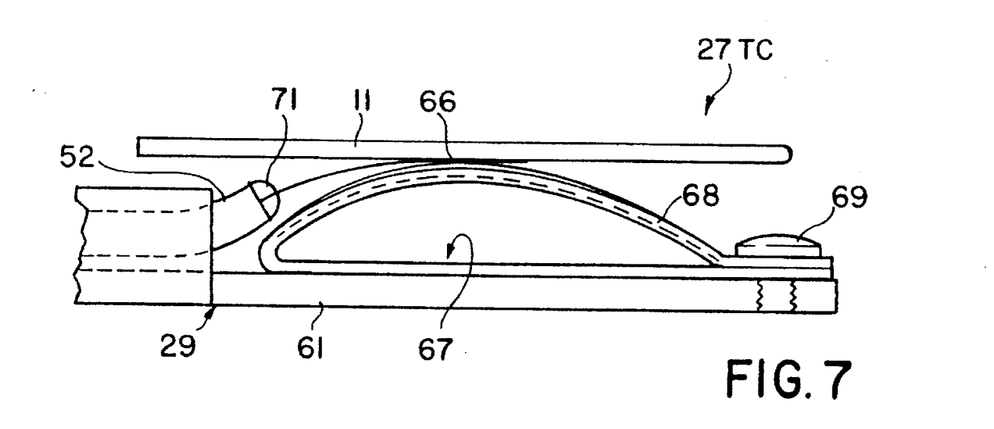

Referring primarily to FIGS. 6 and 7, there are shown details of the thermocouple-wafer interface provided by the combined wafer and thermocouple support finger assembly 27TC. As shown, the basket section 29 has a flattened end 61 which forms the base of the finger assembly. A thermocouple support 67 in the form of a strip of ceramic felt material formed into a bowed/convex loop 68 is mounted to the top of the support base 61 by screw 69. A thermocouple 65 such as an aluminum-chromel thermocouple is attached to the wires 39 and is sealed to the end of sheath 52 by glass adhesive 71. The thermocouple junction point 66 preferably is positioned at the highest point along the support member 68 so that, when a wafer 11 is positioned on the basket and supported by the three fingers 27, 27 and 27TC, the thermocouple junction point is located precisely between the highest point of the wafer support member 68 and the wafer. With the wafer and thermocouple positioned in this manner, the weight of the wafer and the inherent spring action of the support 67 provide good thermal contact between the wafer and the junction point, and the contact is shielded from the radiation by the support.

As mentioned, the design and material of the backside wafer and thermocouple support 67 are critical to the performance of the thermocouple, as is indicated by the design selection criteria which include: shielding and insulating the thermocouple junction from any lamp radiation; reliably and stably supporting the thermocouple junction in contact with the wafer; no adverse affect on the speed of response of the thermocouple assembly; no particle contamination; and imperviousness to the typically very caustic process chemistry. The above criteria are satisfied by the design depicted in FIGS. 6 and 7 and by forming the support 67 from ceramic felt such as aluminum oxide felt, which is available, for example, from Cotronics, Corp. of Brooklyn, N.Y.

3. Alternative Finger Assemblies

Figure 8:
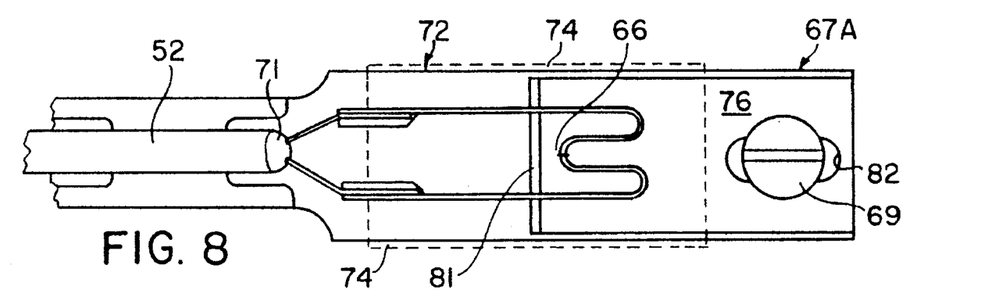
FIGS. 8 and 9 are top plan and side elevation views, respectively, of an alternative embodiment of the finger support assembly shown in FIGS. 6 and 7.
Figure 9:
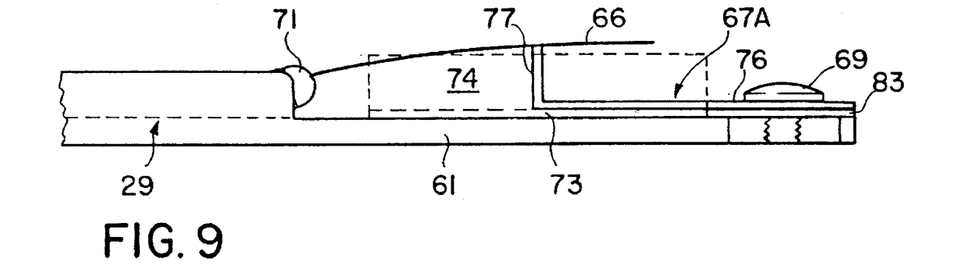

FIGS. 8 and 9 depict another embodiment of the finger assembly 27TC which uses an alternative support 67A having the required characteristics. Support 67A is an L-shaped bracket having legs 76 and 77 and is formed of low mass, low thermal conductivity, thermally transparent material such as quartz, which is not attacked by the process gas chemistry. One leg 76 lies along the base 61 of the finger and is affixed to the base by screw 69. The thermocouple 65 rests on the upper edge 81 of the second leg or upright 77. A slot 82 may be formed in the bracket base 76 to permit adjusting the position of the bracket along the finger relative to the thermocouple so that the supporting edge 81, which supports both the thermocouple 65 and the wafer 11, is positioned closely adjacent the thermocouple junction points 66. The quartz bracket 67A may be thermally isolated from the finger base 61 by a washer 83 of material such as quartz or magnesium fluoride covered stainless steel.

In addition, a thermal shield of material such as aluminum may be attached to the finger to shield the thermocouple and the thermocouple-wafer contact region from radiation. The illustrated shield 72 comprises a horizontal base 73 and vertical opposite sides 74 which define a generally U-shaped configuration. The length of the base 73 is approximately the same as the length of the thermocouple 65 while the height of the sides 74 is approximately the same as the height of supporting bracket upright 77. Thus, when mounted on the finger base 61 substantially directly beneath the thermocouple and between the bracket 67A and the base 61, the shield 72 effectively thermally isolates the thermocouple and the thermocouple-wafer contact region from radiation incident from below and from the sides.

Figure 10:
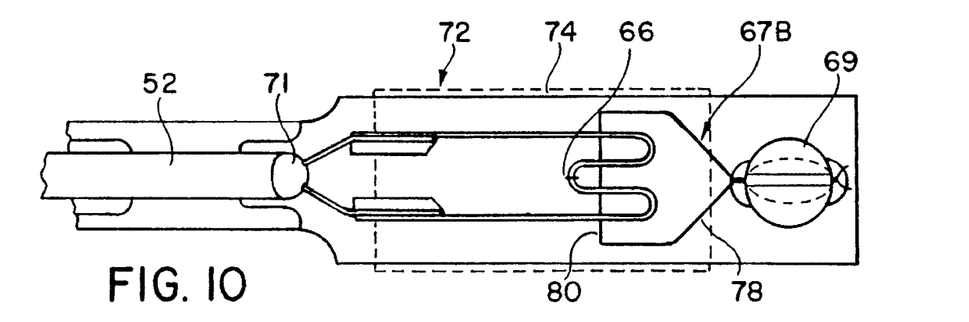
FIGS. 10 and 11 are top plan and side elevation views of a second alternative embodiment of the finger support assembly depicted in FIGS. 6 and 7.
Figure 11:
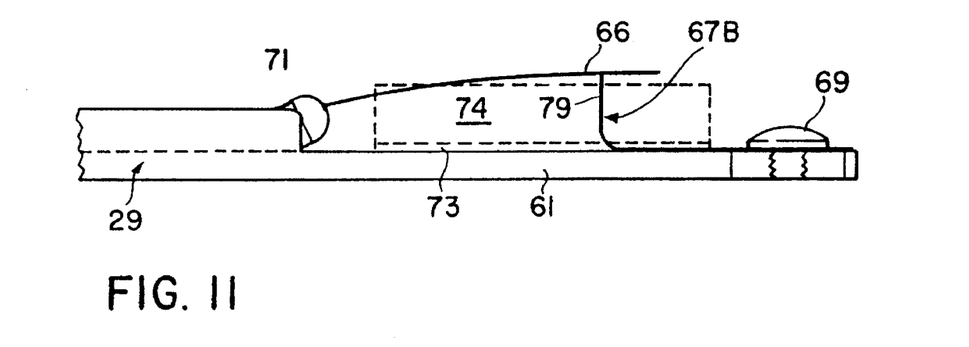

FIGS. 10 and 11 depict yet another embodiment of our finger assembly 27TC, one which uses an alternative support 67B having the requisite characteristics. Support 67B is a formed wire member comprising a base section which is attached to the finger and an upright inverted U-shaped section which supports the thermocouple adjacent the thermocouple junction point 66. Specifically, the base 80 of the inverted U extends transverse to the finger for supporting the thermocouple 65. At the bottom of the vertical uprights 79—79, the wire is bent to form generally horizontal converging sections 78 for attachment by screw 69 to the finger base 61. As viewed from the side as in FIG. 11, the wire member has a generally L-shaped configuration. In one example, the required low mass, low thermal conductivity characteristics are provided by a member 67B, configured as described, which is a 5 mil diameter magnesium fluoride covered stainless steel wire.

Figure 12:
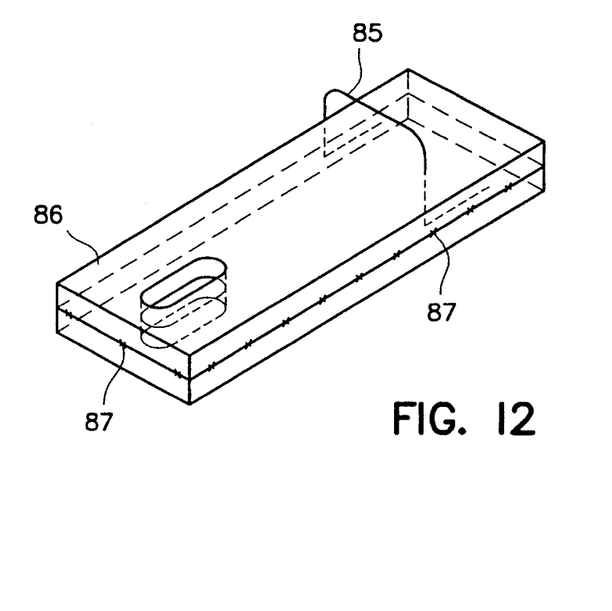
FIG. 12 depicts a third alternative embodiment of our finger support assembly.

FIG. 12 depicts another wire member embodiment, one in which a wire member 85 is mounted between the two sections of a quartz base 86 which are welded together, as indicated at 87. The protruding section of the wire member forms an inverted U-shaped support for the thermocouple and wafer.

Figure 13:
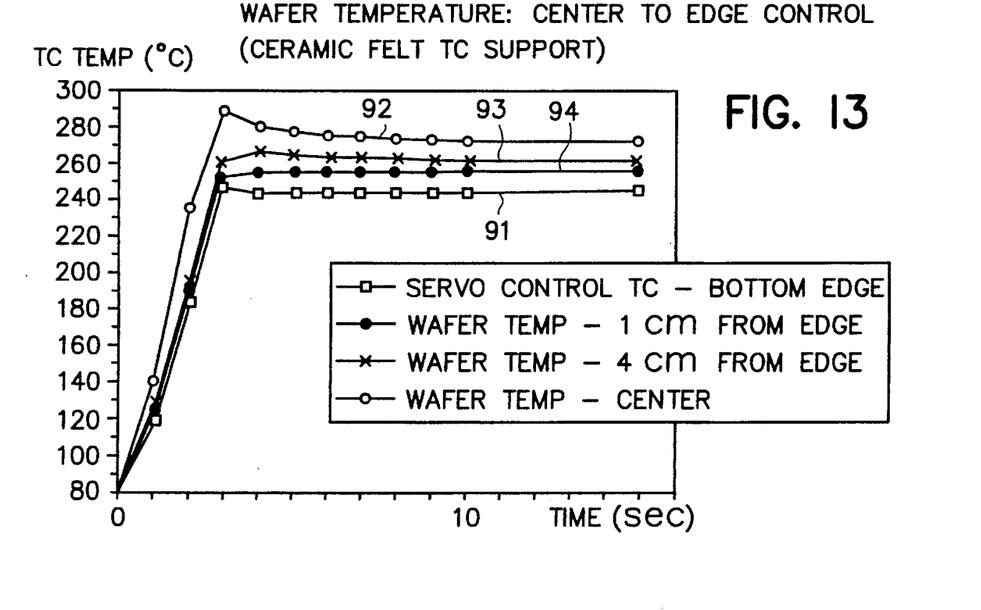
FIG. 13 depicts representative temperature monitoring performance using our device.

FIG. 13 depicts representative wafer temperature monitoring performance using the ceramic felt embodiment of our combined wafer support basket and thermocouple apparatus. Curve 91 represents the measured wafer temperature using our device. Curves 92, 93 and 94 are the wafer center, midpoint and edge temperatures, respectively, obtained for example using the probe arrangement shown in FIG. 5. FIG. 13 indicates that the system provides center-to-edge uniformity and point-of-measurement accuracy. The temperature readings using our apparatus closely track the changes in wafer temperature.

On the basis of the above description of preferred and alternative embodiments of our invention, those of usual skill in the art will readily derive other modifications and versions which are within the scope of the appended claims.

What is claimed is:

1. A method for supporting a semiconductor wafer in a combined wafer support and thermocouple assembly, the method comprising the steps of:

placing a thermocouple, which has a thermocouple junction, on a support member of low mass and low heat constant, the support member being part of one of a plurality of support fingers in a wafer support basket;

placing a wafer on the wafer support basket, and thereby compressing the thermocouple junction between the wafer and the support member, whereby good thermal connection is made for accurate wafer temperature measurement; and shielding the thermocouple junction, with the support member, from any radiation emanating from a position beneath the wafer.

2. A method as defined in claim 1, wherein:

the method further comprises forming the support member, prior to placing the thermocouple, as a bowed convex loop of ceramic felt material, the loop having a highest point for contact with the wafer: and the step of placing the thermocouple on the support member positions the thermocouple at the highest point in the convex loop of the support member.

3. A method as defined in claim 2, wherein:

the convex loop of the support member provides a spring action to maintain good contact between the thermocouple and the wafer.

4. A method as defined in claim 1, and further comprising:

installing a supplementary thermal shield between the thermocouple and a source of radiation.

\* \* \* \* \*